United States Patent
Lin

(10) Patent No.: US 6,774,699 B1
(45) Date of Patent: Aug. 10, 2004

(54) BJT MIXER FOR LOW SUPPLY VOLTAGE

(75) Inventor: Hung Chang Lin, Silver Spring, MD (US)

(73) Assignee: Maryland Semiconductor, Inc., Clarksburg, MD (US)

( * ) Notice: Subject to any disclaimer, the term of this patent is extended or adjusted under 35 U.S.C. 154(b) by 0 days.

(21) Appl. No.: 10/616,212

(22) Filed: Jul. 10, 2003

(51) Int. Cl.[7] .................................................. G06G 7/12
(52) U.S. Cl. ........................ 327/355; 327/411; 327/356
(58) Field of Search ................................ 327/355, 356, 327/411, 113, 116, 119; 455/333

(56) References Cited

U.S. PATENT DOCUMENTS

| | | | | |
|---|---|---|---|---|
| 5,784,692 A | * | 7/1998 | Kleinberg | ................... 455/333 |
| 6,388,501 B2 | * | 5/2002 | Chien | ......................... 327/355 |

* cited by examiner

Primary Examiner—Timothy P. Callahan
Assistant Examiner—Cassandra Cox
(74) Attorney, Agent, or Firm—H. C. Lin

(57) ABSTRACT

A BJT operating as a mixer has its collector biased at the knee of the $I_C$ vs $V_{CE}$ characteristic. A local oscillator voltage is applied to the base and an RF signal voltage is applied to the collector through a singled-ended emitter follower. The nonlinear curvature at the knee produces a beat frequency current. The base of the emitter follower can be fed from a current mirror or through an ohmic resistor. This mixer requires less supply voltage, and results in more conversion gain and less feed-through of the RF input signal than the Gilbert multiplier. Alternatively, the RF voltage can be applied to the gate and the local oscillator voltage can be applied to the drain. Sometimes, it is more desirable to invert the collector and the emitter, or to connect a normal transistor and an inverted transistor in parallel to optimize conversion gain.

12 Claims, 10 Drawing Sheets

BJT MIXER FOR LOW SUPPLY VOLTAGE

BACKGROUND OF THE INVENTION

(1) Field of the Invention

This invention relates to analog mixers or multipliers, in particular, to electronic mixers or multipliers using bipolar transistors. Such mixers are used for multiplying two input signals or for converting two difference frequency signals into a beat frequency output.

(2) Brief Description of Related Art

In a conventional radio receiver, the incoming radio frequency is mixed with a local oscillator (LO) signal to produce a beat frequency, which is the intermediate frequency (IF). The IF is then amplified and filtered to attenuate other unwanted signals, A popular mixer circuit is the differential pair or Gilbert multiplier. A bipolar transistor version of the Gilbert multiplier is shown in FIG. 1. Basically, a differential amplifier with a differential pair Q2 and Q3 is fed from a current source Q1. The differential gain of the differential amplifier is proportional to the transconductance gm of Q2 and Q3. This transconductance varies as the dc collector current of Q2 and Q3, which is controlled by the collector current of Q1. The dc collector current $I_{C1}$ of Q1 is controlled by the dc base current $V_{B1}$ of Q1. When a local oscillator signal $V_{LO}$ of frequency $f_{LO}$ is applied differentially to Q2 an Q3 (i.e. $V_{LO+}$=Vin−/2 and $V_{LO-}$=Vin+/2 respectively), and a radio frequency signal $V_{rf}$ of frequency $f_{rf}$ is applied to the base of Q1, the output current of the differential amplifier is equal to $V_{LO}*gm_2$, and the $gm_2$ is proportional to $Vrf*gm_1$. When the $V_{rf}$ is multiplied by $V_{LO}$, a beat frequency $f_{if}=f_{rf}\pm f_{LO}$ intermediate frequency signal $V_{if}$ is produced.

While the Gilbert multiplier is widely used, it has a number of drawbacks for low voltage and low power applications. In modern integrated circuit technology, the tendency is to use a low supply voltage $V_{CC}$: for instance 25 V for 0.25 μm technology and 1.8 V for 0.18 μm technology. In the Gilbert mixer, the current source is operating in the active region of the $V_{CE1}$ vs $I_{C1}$ V-I characteristic Q1 in FIG. 2 to obtain a higher transconductance and is proportional to $V_{rf}$. Therefore the dc collector voltage $V_{C1}$ for the current source Q1 must not forward bias the collector junction, i.e. about the same as the dc base voltage (≈0.7V for silicon BJT) to operate in the active region.

Similarly, the differential pair Q2 and Q3 also must have its collector voltage high enough to operate in the active region. Since the dc base voltage is about 0.7V higher than the emitter voltage of Q2 or $V_{C1}$ (≈0.7V), the dc base voltage of Q2, hence the dc collector voltage, must be at least about 2×0.7V or 1.4V. This voltage is higher than certain kind of battery voltage of 1.3 V.

If a resistor is used as a load, another voltage drop $V_L$ will be added to be supplied by the power supply $V_{CC}$. These three stacks of voltages, $V_{CE1}$, $V_{CE2}$ and $V_L$, dictate that the supply voltage cannot be made very low. For a typical base-to-emitter voltage of 0.7 V, there is hardly any "head room" for signal voltage swing. Besides, a higher supply voltage consume more power.

In U.S. Pat. No. 6,388,501, Chien disclosed an MOSFET mixer operating at the knee of the drain V-I characteristics of the MOSFET. Since a MOSFET is gate voltage control device while a BJT is a base current control device and since the drain and source characteristics of a MOSFET are symmetrical but the collector and emitter characteristics of a BJT are not symmetrical, Chien's circuit is not applicable to a BJT mixer.

SUMMARY OF THE INVENTION

An object of this invention is to design a BJT mixer which requires a lower supply voltage than the Gilbert mixer or similar structure. Another object of this invention is to reduce the power consumption of the BJT mixer. Still another object of this invention is to provide a high conversion gain of the mixer. A further object of this invention is to set the operating point of the mixer at its optimum conversion gain automatically These objects are achieved by mixing the RF signal and the local oscillator signal at the knee of the output $V_{CE}$-$I_C$ characteristic of a BJT as shown in FIG. 2 with constant base current $I_{B1}$. At the knee, the characteristic has the sharpest curvature. The nonlinearity produces a maximum beat frequency signal. For implementation, a mixer BJT is biased at the knee of the $V_{CE}$-$I_C$ characteristic. The LO (or RF) signal voltage $V_{LO}$ (or $V_{rf}$) is applied at the base of the mixer BJT, and the RF (or LO) signal voltage $V_{rf}$ (or $V_{LO}$) is injected at the collector of the mixer BJT. Then a beat frequency drain current is produced. Specifically, the gate of a single-ended mixer BJT is fed with a local oscillator signal and the collector of the mixer is dc coupled to a single-ended emitter follower with the base fed from a radio frequency signal or vise versa.

BRIEF DESCRIPTION OF THE SEVERAL VIEWS OF THE DRAWINGS

FIG. 6b shows a modification of FIG. 6a.

DETAILED DESCRIPTION OF THE INVENTION

Figure 1:
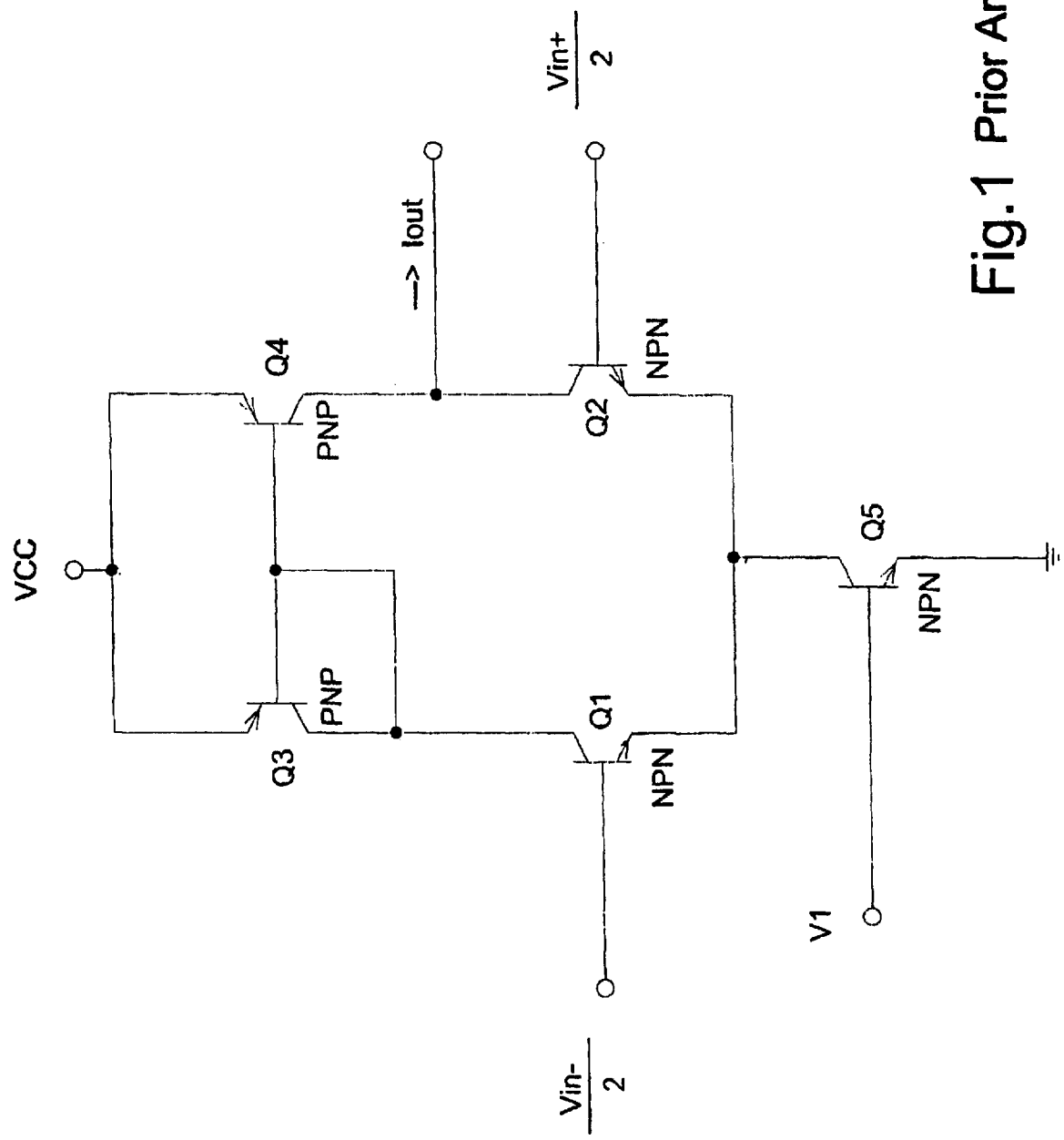
FIG. 1 shows a prior art Gilbert BJT mixer.
Figure 2:
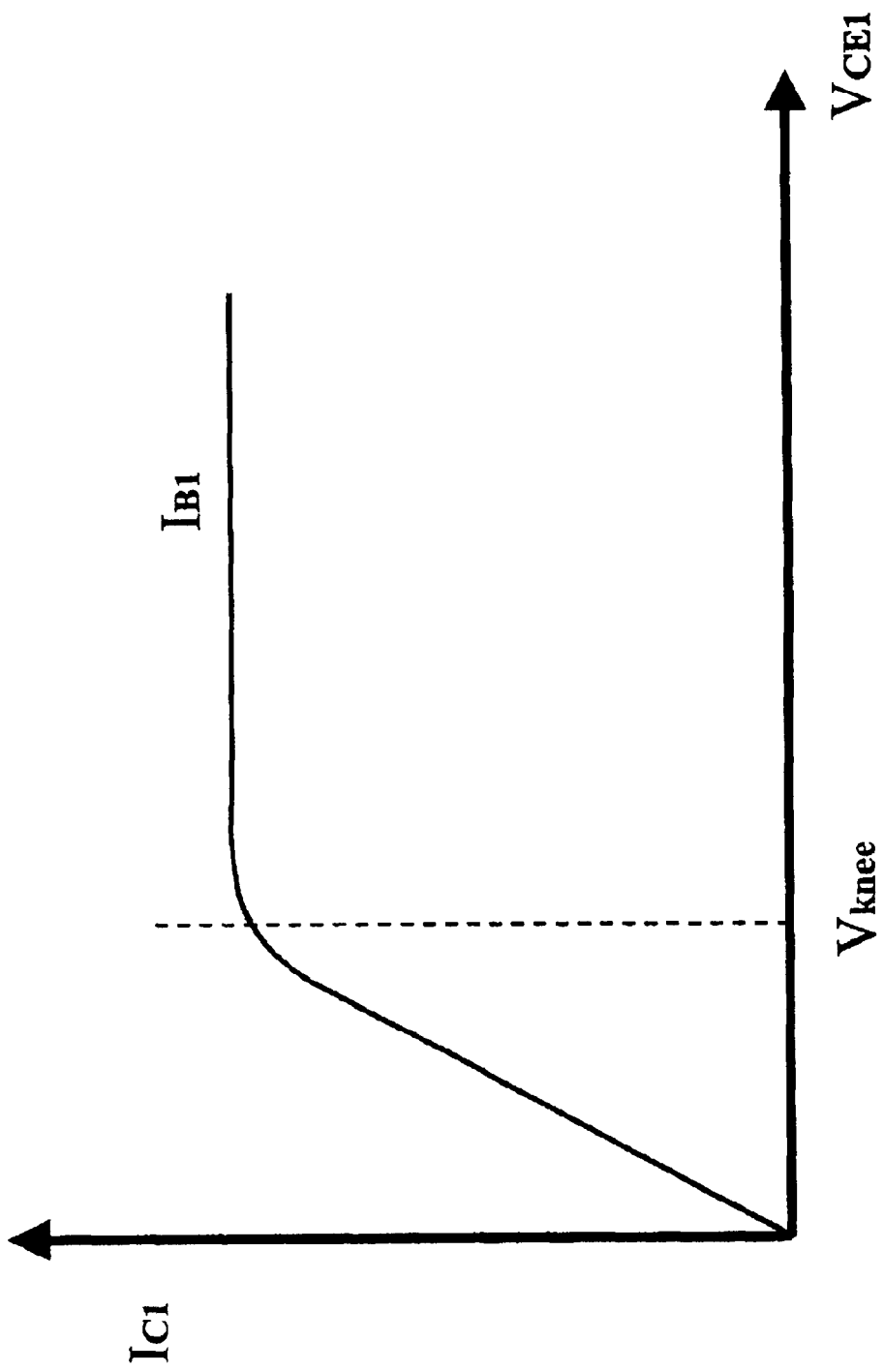
FIG. 2 shows the output $V_{CE}$-$I_C$ characteristic of BJTs.
Figure 3:
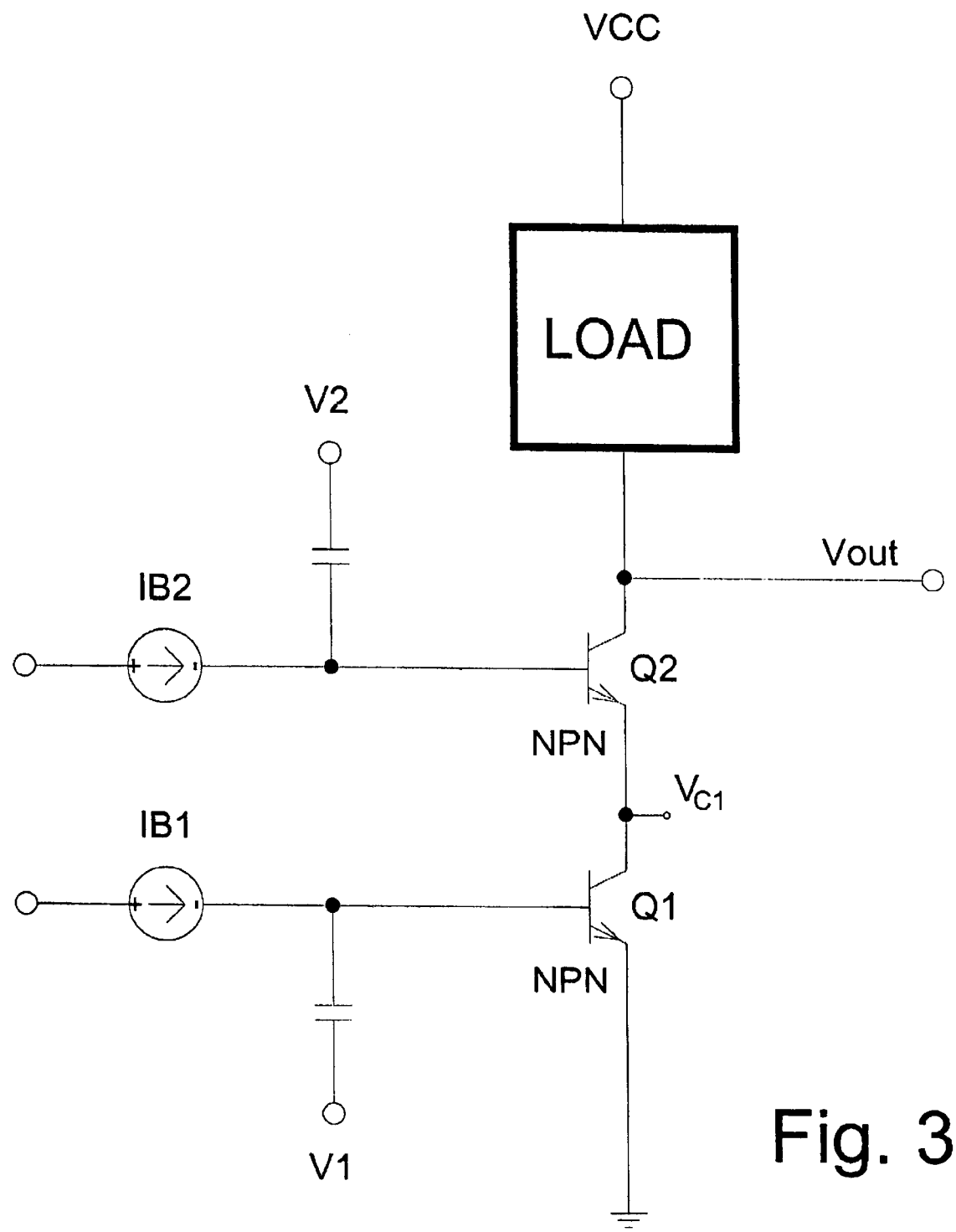
FIG. 3 shows the basic mixer circuit of the present invention.

Principle of Operation:

The basic circuit of the present invention is shown in FIG. 3. Two NPN BJTs Q2 and Q1 are connected in series. The pull-down BJT Q1 has its emitter grounded and its collector C1 connected to the source of the pull-up BJT Q2. The drain C2 of Q2 is connected through a load $R_L$ to the positive power supply $V_{CC}$. The RF voltage $V_{rf}$(V1) is ac couipled to the base of Q1, which is fed with a dc base current IB1. The collector C1 of the Q1 is set at a quiescent voltage $V_{knee}$ at the knee of the $V_{CE}$-$I_C$ characteristic of Q1 as shown in FIG. 2. The appropriate $V_{knee}$ is set by applying the appropriate dc base current IB2 of Q2.

A LO signal voltage $V_{LO}$(V2) is ac coupled to the base of Q2, and an RF voltage $V_{rf}$(V1) is ac coupled to the base of Q1. At the knee of the $V_{CE}$-$I_C$ characteristic of Q1, the $V_{CE1}$ in saturation region is related to the dc collector current $I_{C1}$ and the overdriving $I_{B1}$ as follows:

$$V_{CE1} = V_T \ln\{\alpha_1(1-I_{C1}/\beta_F I_{B1})/[1+(1-\alpha_1)I_{C1}/I_{B1}]\} \quad (1)$$

where $V_T$ is the thermal voltage q/kT (≈0.025 V at 27° C.), $\alpha_1$ is the inverse alpha, $\beta_N$ is the normal β. Eq.1 neglects the ohmic resistance which may cause $V_{CE1}$ to be somewhat higher. Differentiate Eq.(1) with respect to $V_{CE1}$ and transpose to obtain the slope of the $V_{CE1}$ vs $I_{C1}$ characteristics, $$d(I_{C1}/I_{B1})/dV_{CE1} = -\alpha_1[1+(I_{C1}/I_{B1})(1-\alpha_1-1/\beta_N)-(1-\alpha_1)(I_{C1}/I_{B1})^2/\beta_N]/[1/\beta_N+(1-\alpha_1)] \quad (3)$$

Differentiate Eq.(3) with respect to $V_{CE1}$ again to get the second derivative, $$d^2(I_{C1}/I_{B1})/V_{CE1}^2 = [(1-\alpha_1-1/\beta_N)-2(I_{C1}/I_{B1})(1-\alpha_1)/\beta_N]/[1/\beta_N+(1-\alpha_1)] \quad (4)$$

Set Eq.(4) to zero to obtain the maximum curvature at the knee of the $V_{CE1}$ vs $I_{C1}$ characteristics, $$(I_{C1}/I_{B1})_{knee} = [\beta_N - 1/(1-\alpha_1)]/2 \quad (5)$$

Substitute Eq.(5) into Eq.(3) to obtain the maximum curvature, $$[d(I_{C1}/I_{B1})/dV_{CE1}]_{max} = \{4\beta_N+(1-\alpha_1)[\beta_N-1/(1-\alpha_1)]^2\}/\{4V_T[1/\beta_N+(1-\alpha_1)]\} \quad (6)$$

When a signal $V_{rf}$ is applied to the base of Q1, the signal superimposes an ac current on $I_{C1}$ equal to $$V_{rf} gm1 = V_{rf} I_{C1}/V_T \quad (7)$$

and the total collector current of Q1 becomes $$I_{c1} = I_{C1}(1+V_{rf}/V_T) \quad (8)$$

When an ac voltage $V_{LO}$ is applied to the base of Q2 and since the voltage of the emitter follower is nearly equal to unity, the derivative $$dV_{CE1} \approx V_{LO} \quad (9)$$

Substitute Eq. (8) into eq.(6) and multiply $dV_{CE1}$ to obtain the output current, $$dI_{C1} = [(z+1)/I_{C1}(1+V_{rf}/V_T)][dV_{CE1}]/[2(z-1)V_T] \quad (10)$$

where $$z = \beta_N(1-\alpha_1) \quad (11)$$

The ac product output current is:

$$I_{out} = [(z+1)/2(z-1)]I_{C1}(V_{rf} V_{LO})V_T^2 \quad (11)$$

which develops an output voltage Vout when a Load is connected the collector of Q2. If z>>1, $$I_{out} \approx I_{C1}(V_{rf} V_{LO})/(2V_T^2) \quad (12)$$

which can be proven to be the same as a Gilbert multiplier. Thus, the product or conversion gain of this invention is no less than the Gilbert multiplier, but requires less dc supply voltage and hence less power dissipation.

Circuit Implementation:

The collector current $I_{C1}$ is controlled by the base current $I_{B2}$ and is equal to $\beta_2 I_{B2}$ of Q2. To bias the collector of Q1 to the proper knee of $I_{C1}$, the dc base current $I_{B1}$ must be overdriven to satisfy Eq.(5), i.e. $I_{B1}$ must be larger than $I_{B2}$ for the same dc collector current $I_{C1}$.

Figure 4:
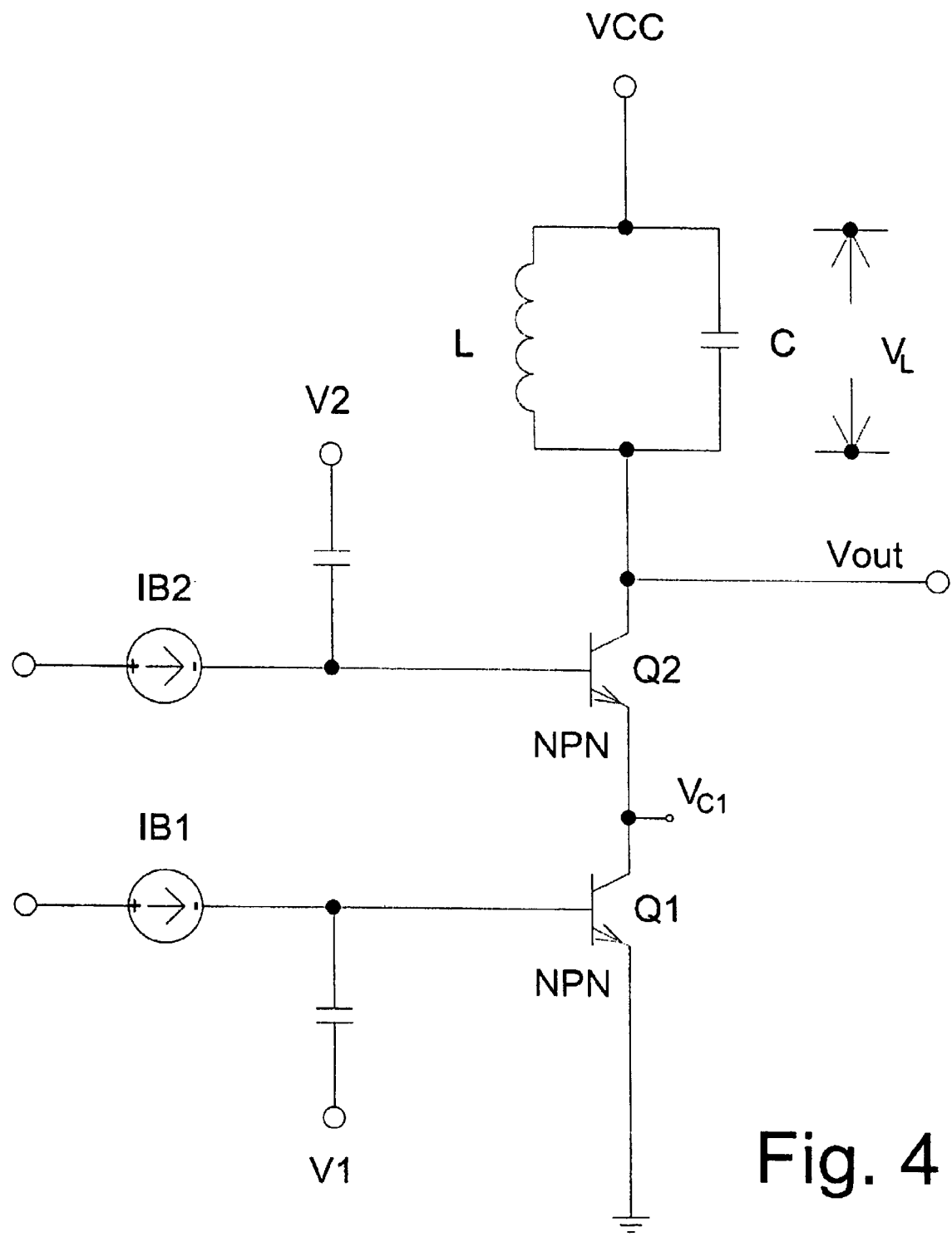
FIG. 4 shows a tank circuit in series with the BJT mixer for deriving a beat frequency output.

In FIG. 4, a parallel LC resonant tank circuit tuned to an intermediate frequency is connected as a load to the mixer to derive a beat frequency output voltage $V_L$.

Figure 5A:
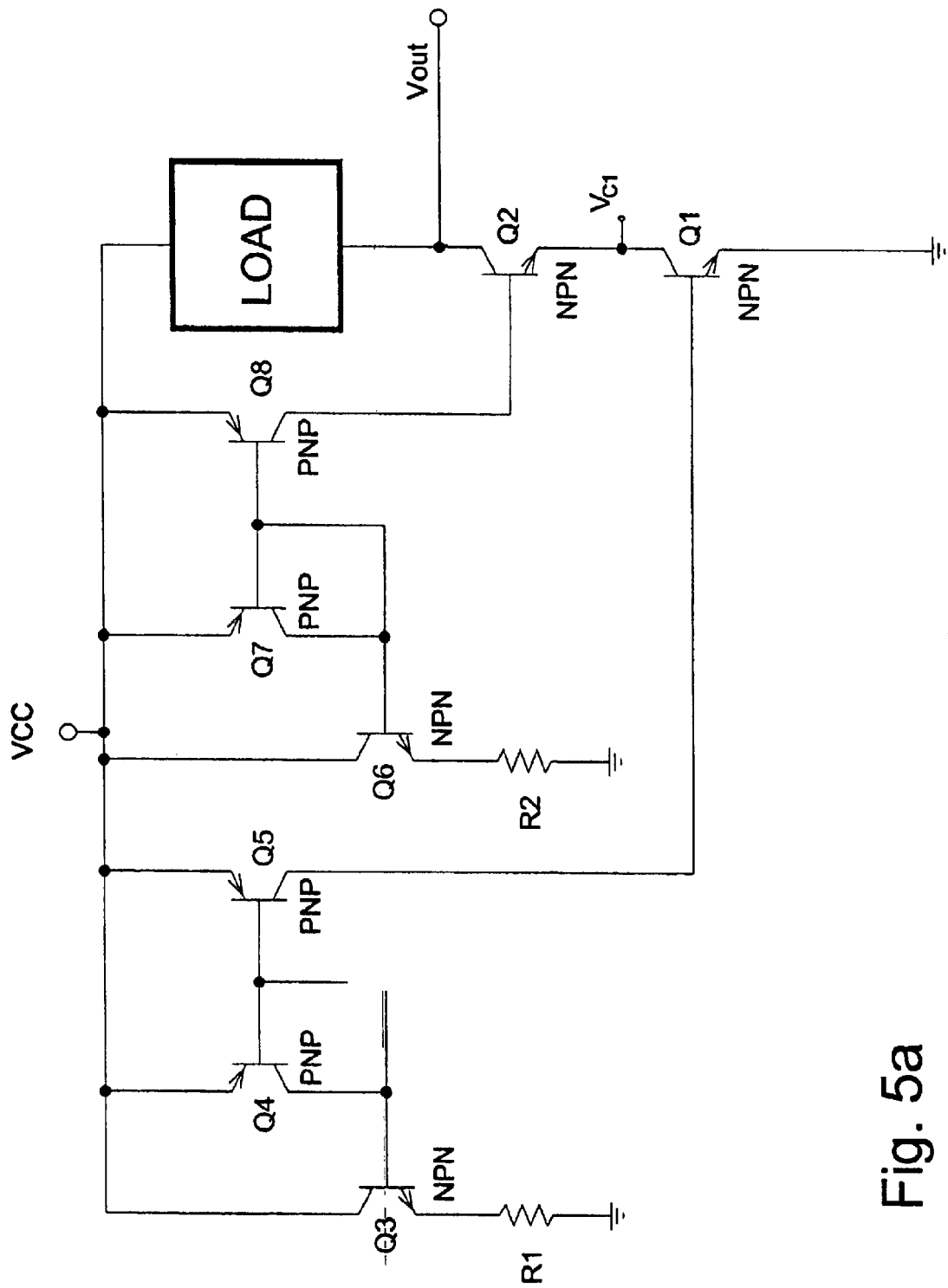
FIG. 5a shows a biasing circuit for automatically biasing the mixer BJT to the collector knee voltage using a BJT current mirror.

A circuit to provide the proper base currents $I_{B1}$ and $I_{B2}$ is shown in FIG. 5a. In this circuit, the base current $I_{B1}$ is supplied from a current mirror comprising PNP transistors Q4 and Q5, which mirrors the base current of NPN transistor Q3. The dc emitter current of Q3 is controlled by the resistor R1 in series with the emitter of Q3, and collector of Q3 is connected to the positive power supply $V_{CC}$. The base current $I_{B2}$ is supplied from another current mirror comprising PNP transistors Q7 and Q8, which the base current of NPN transistor Q6. The emitter current of Q6 is controlled by the resistor R2 in series with the emitter of Q6. The value of R2 should be such that the base current $I_{B2}$ satisfies Eq. (5), which is less than $I_{B1}$. Then, the collector voltage $V_{CE1}$ of Q1 is automatically biased to the knee of the collector characteristics. The input voltages V1 ($V_{rf}$) and V2 ($V_{LO}$) are capacitively coupled to the bases of Q1 and Q2, respectively as shown in FIG. 3 or FIG. 4. These two voltages can be reversed without any difference to the conversion gain as shown in Eq.(12).

Figure 5B:
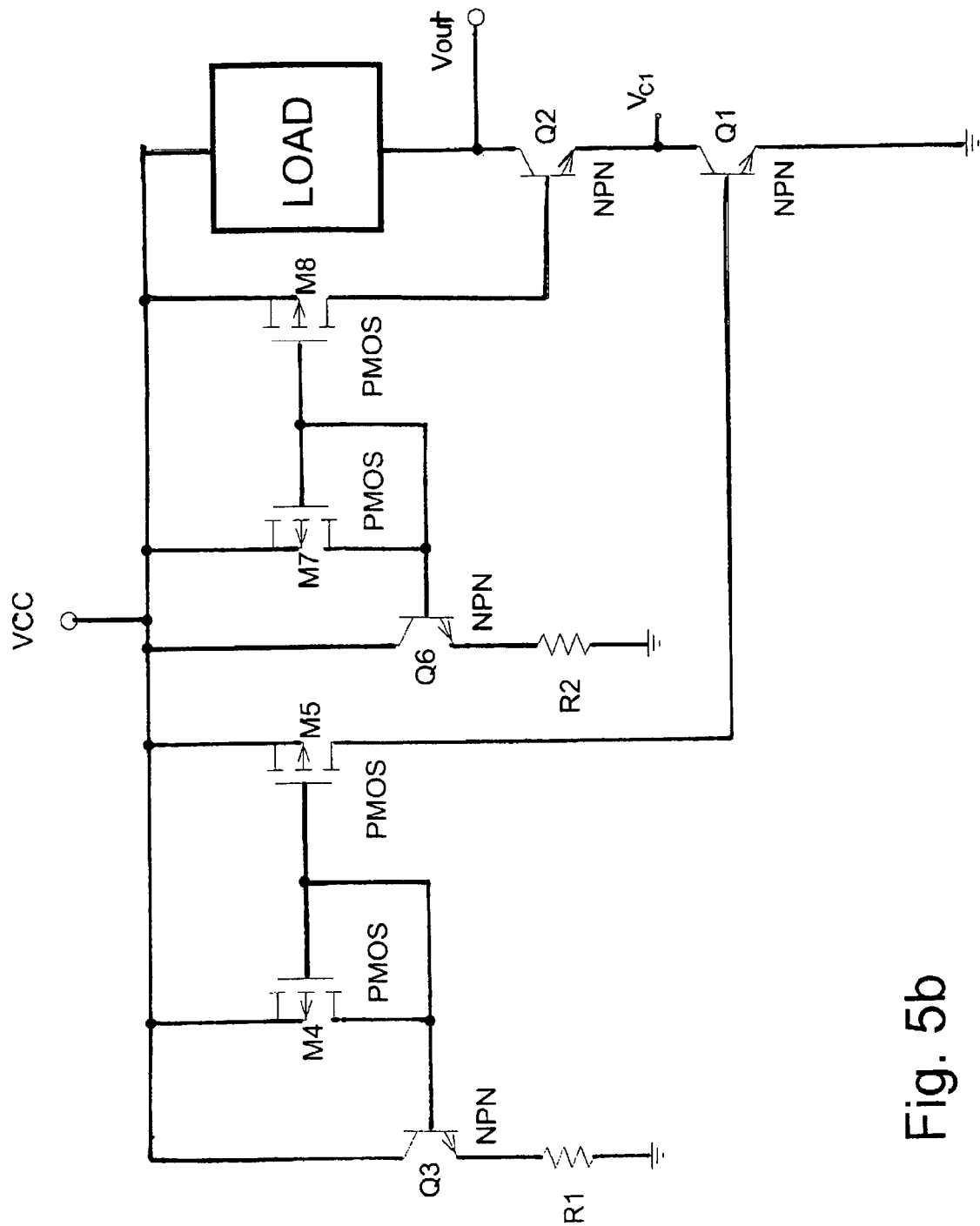
FIG. 5b shows a MOSFET current mirror.

In FIG. 5a, Q1 is saturated and $V_{CE1}$ is typically less than 0.2V. The dc base voltage $V_{2B}$ is typically $V_{BE2}$ (≈0.7V) higher than its emitter voltage which is equal to $V_{CE1}$. Then, $V_{2B} = V_{CE1}+0.7$ V≥0.9V. For the current mirror shown in FIG. 5a, the current mirror Q3 should be in the active region, say $V_{CE3}$≥0.3V below the supply voltage $V_{CC}$. Then the minimum supply voltage $V_{CC}$≥$V_{CE1}+0.7+V_{CE3}$≈1.2V, which is lower than most single battery voltage. In this circuit, the PNP BJTs Q7 and Q8 can be replaced by two p-channel MOSFETs M7,M8; and the PNP BJTs Q4, Q5 be replaced by M4, M5 to serve as a similar current mirror, as shown in FIG. 5b. By choosing the dc base current of Q1 to nearly twice that of Q2, the operating point is automatically set to the knee of the collector Vc-Ic characteristic.

Figure 6A:
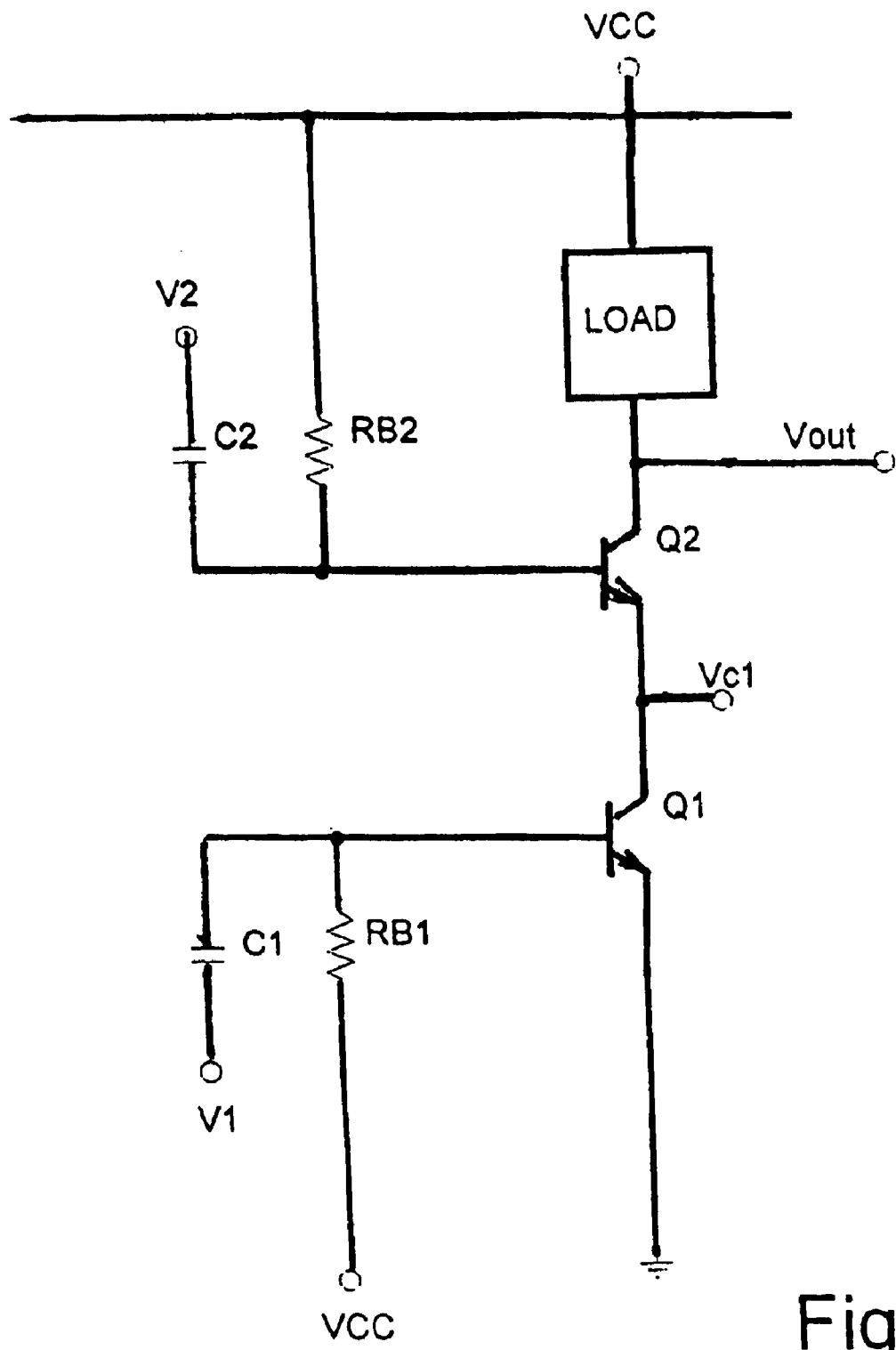
FIG. 6a shows a second embodiment of the biasing circuit using an ohmic base resistor to bias the emitter follower.
Figure 6B:
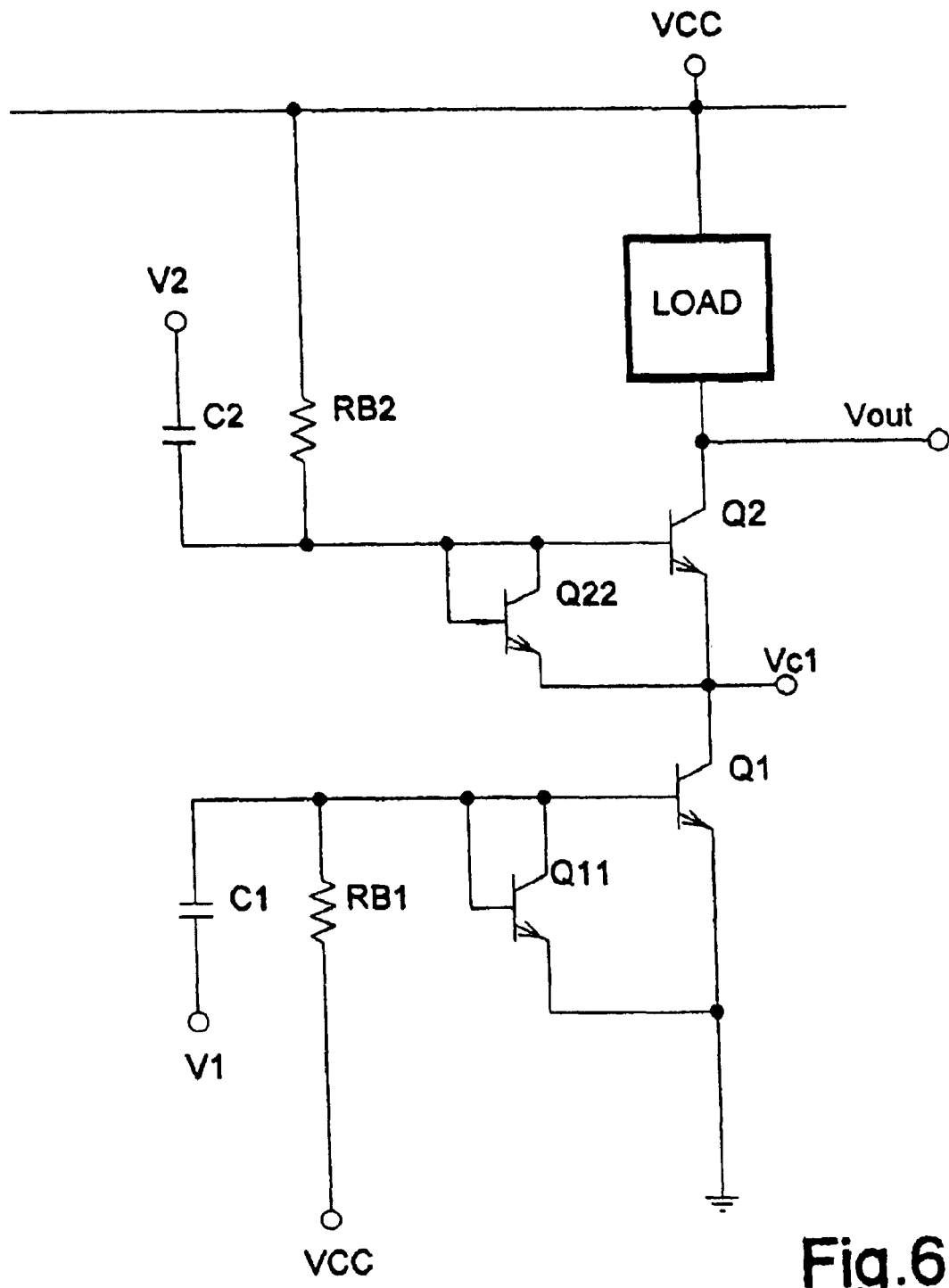

If the base current IB2 of Q2 is fed through a resistor RB2 instead of the current mirror as shown in FIG. 6a, the voltage drop across the resistor, say 0.1 V, can be less than the voltage drop of a current mirror. Then the required supply voltage $V_{CC}$≥$V_{CE1}+V_{BE2}+V_{RB2}$=1.0V is even lower than that required in FIG. 5a or FIG. 5b. However, the required resistor RB2 is function of the current gain β of Q2, which may vary over a wide range. By operating Q2 as a current mirror of Q8 as shown in FIG. 6b, the effective beta, hence the value of the resistor, can be fixed. The resistor RB2 can be a MOSFET operating in the ohmic region. Then the voltage drop $V_{DS3}$ across the MOSFET or RB2 can be less than $V_{CE3}$ in FIG. 5a or FIG. 5b, say 0.2 V. Thus, the required supply voltage becomes $V_{CC}$≥$V_{CE1}+V_{BE2}+V_{DS3}$=1.0 V and is even lower than that required in FIG. 5a or FIG. 5b. It can be seen from FIGS. 5a, 5b and 6a, 6b that the required supply voltage $V_{CC}$ is considerably lower than that required for the Gilbert multiplier or mixer.

Figure 7:
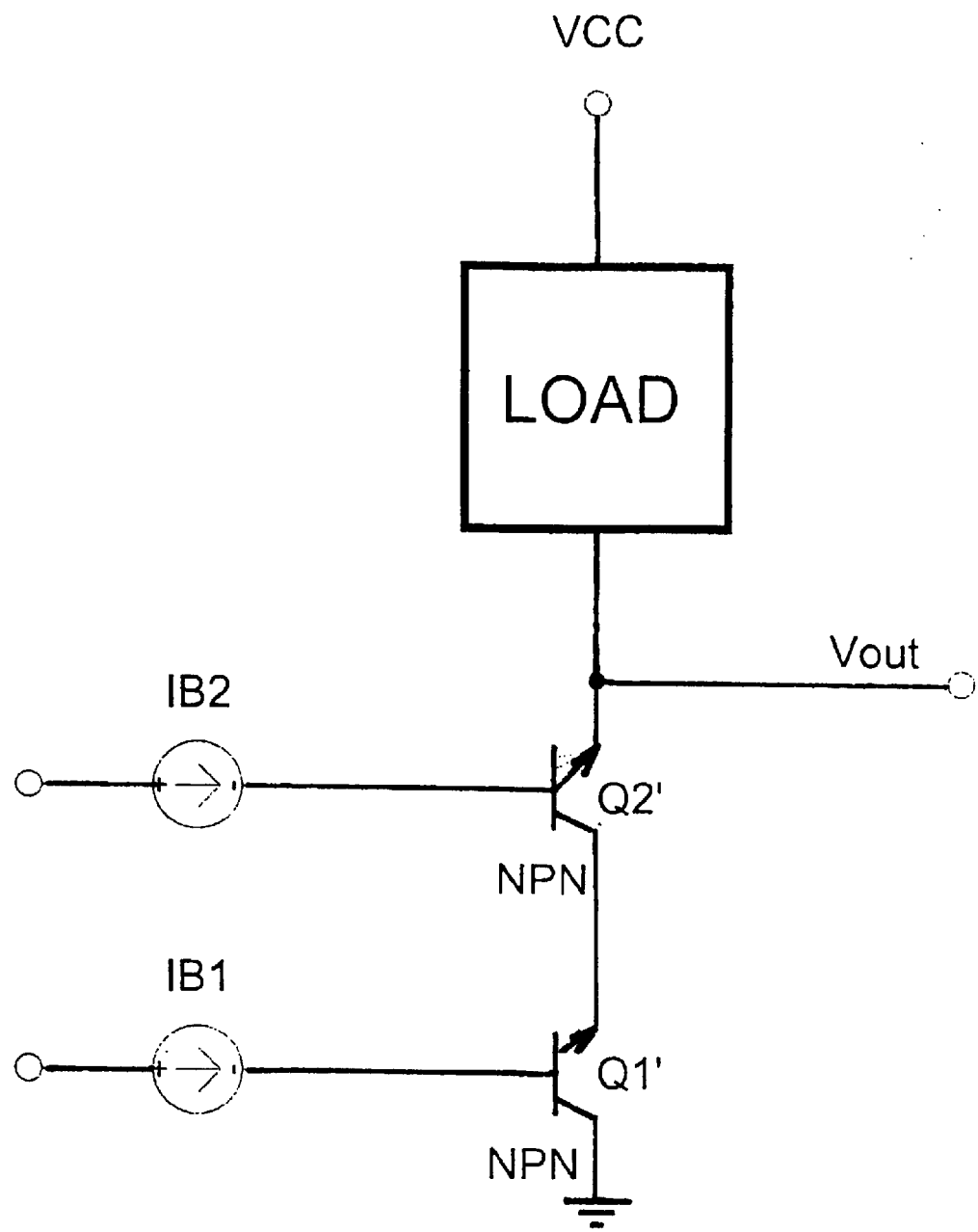
FIG. 7 shows an inverted BJT mixer.
Figure 8:
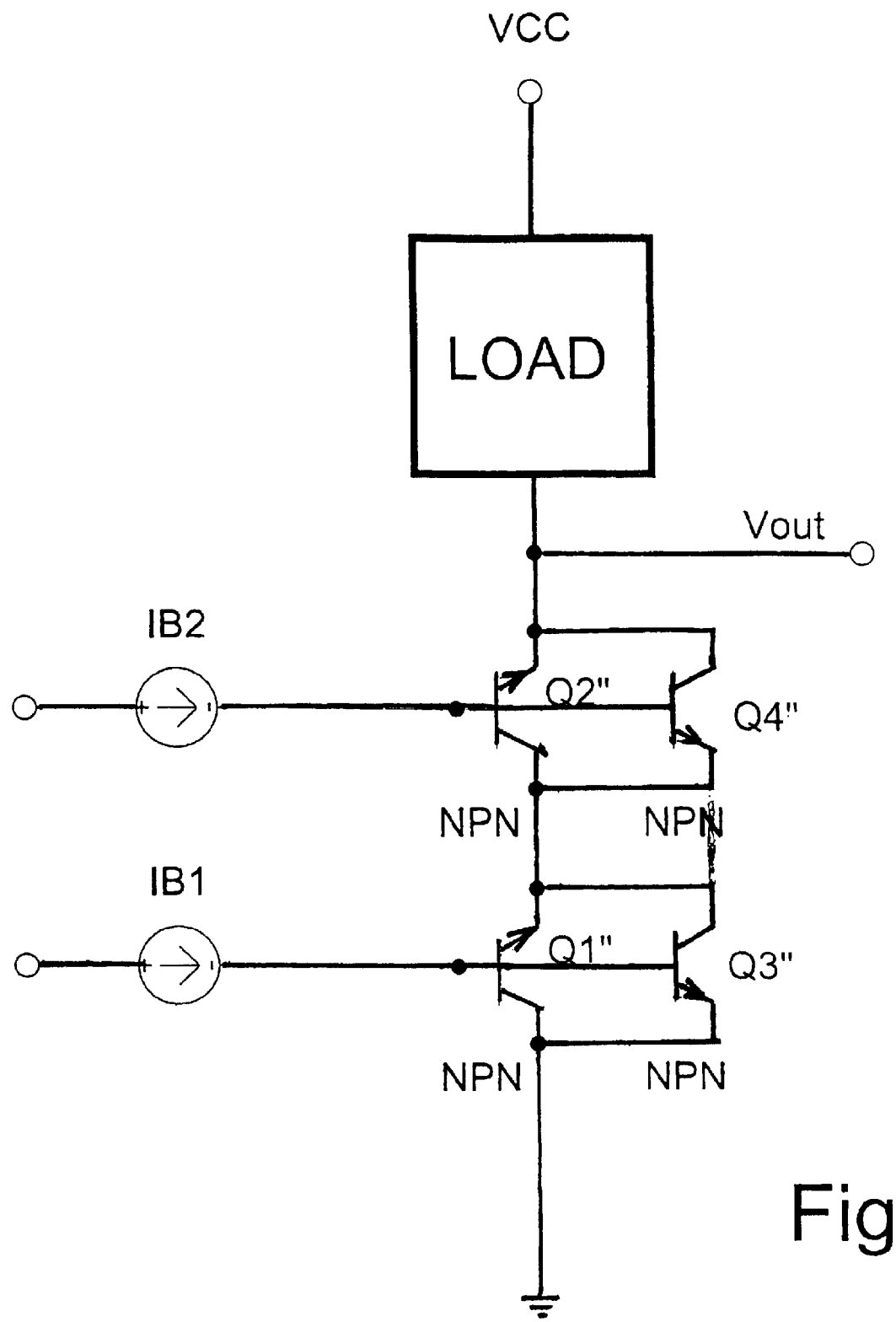
FIG. 8 shows a parallel normal and inverted BJT mixer.

Since the gain of the mixer is dependent upon the quantity $z[=\beta_N(1-\alpha_1)]$ and the value of z may vary widely for different types of BJT with typically unsymmetrical collector and emitter characteristics, it may be sometimes more desirable to invert the mixer BJTs Q1' and Q2' as shown in FIG. 7, or to connect a normal and an inverted BJTs in parallel as mixer BJTs Q1" and Q2" as shown FIG. 8.

While the foregoing description employs NPN BJTs in FIGS. 1–8, it will be obvious that complementary PNP BJTs can be used by reversing the power supply. In the same token, the transistors used in the current mirrors in FIGS. 5a, 5b and 6a, 6b can also be of complementary types.

What is claimed is:

1. A bipolar junction transistor (BJT) mixer for low supply voltage, comprising:
   a pull-up BJT having a collector connected to a power supply through a load device, an emitter; and a base fed with a first dc base current;

a pull-down BJT having a collector connected to the emitter of said pull-up transistor, an emitter connected to a negative power supply, and a base fed from a second dc base current larger than said first dc base current so as to cause the collector of said pull-down BJT operating at the knee of $I_C$ vs $V_{CE}$ collector characteristics;

a first signal fed to said base of said pull-down BJT;

a second signal fed to said base of said pull-up BJT; and an output collector current of said pull-up transistor proportional to the product of said first signal and said second signal.

2. The BJT mixer as described in claim 1, wherein said second dc base current is approximately equal to twice that said first dc base current.

3. The BJT mixer as described in claim 1, wherein said first signal is capacitively coupled to said base of said pull-down BJT, and said second is capacitively coupled to said base of said pull-up BJT.

4. The BJT mixer as described in claim 1, wherein said pull-up BJT and said pull-down BJT are inverted with the collector serving as an emitter and the emitter serving as a collector.

5. The BJT mixer as described in claim 1, further comprising an inverted BJT connected in parallel with said pull-up BJT, and a second inverted BJT connected in parallel with said pull-down BJT.

6. The BJT mixer as described in claim 1, further comprising a first current mirror for mirroring said first dc base current, and a second current mirror for mirroring said second dc base current.

7. The BJT mixer as described in claim 6, wherein said first current mirror comprises two complementary transistors fed from a first base current of a common collector BJT amplifier with a first series emitter resistance, and said second current comprises two complementary transistors fed from a second base current of a second common collector amplifier with a second series emitter resistor.

8. The BJT mixer as described in claim 7, wherein each of said current mirror comprises two p-channel MOSFETs.

9. The BJT mixer as described in claim 1, where the base current of the pull-up BJT is fed through an ohmic resistor to a positive voltage supply.

10. The BJT mixer as described in claim 9, further comprising a diode-connected BJT between the base and emitter each of the pull-up BJT and the pull-down BJT so as to stabilize the beta to a nearly constant value.

11. The BJT mixer as described in claim 1, wherein said first signal is an RF signal and said second signal is a local oscillator signal, and said output collector current is a beat frequency signal of said first signal and said second signal.

12. The BJT mixer as described in claim 1, wherein said first signal is a local oscillator signal, and said second signal is an RF signal, and said output collector current is a beat frequency signal of said first signal said second signal.

* * * * *